United States Patent
Sato et al.

(10) Patent No.: US 7,352,257 B2
(45) Date of Patent: Apr. 1, 2008

(54) FLEXIBLE PRINT CABLE HAVING ALTERNATING SIGNAL AND GROUND CONDUCTORS AND CONNECTOR FOR THE SAME

(75) Inventors: Koki Sato, Shinagawa (JP); Koichi Kiryu, Shinagawa (JP); Hideo Miyazawa, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 146 days.

(21) Appl. No.: 11/300,311

(22) Filed: Dec. 15, 2005

(65) Prior Publication Data

US 2006/0279371 A1 Dec. 14, 2006

(30) Foreign Application Priority Data

Jun. 14, 2005 (JP) ............................. 2005-173676

(51) Int. Cl.
*H01P 3/08* (2006.01)
*H01P 1/04* (2006.01)
(52) U.S. Cl. ..................... 333/1; 333/238; 333/260
(58) Field of Classification Search ............. 333/1, 333/238, 260
See application file for complete search history.

(56) References Cited

U.S. PATENT DOCUMENTS 3,179,904 A * 4/1965 Paulsen ......................... 333/1
4,130,723 A * 12/1978 Wakeling ..................... 174/36
6,867,668 B1 * 3/2005 Dagostino et al. .......... 333/246
7,154,353 B2 * 12/2006 Dohata ............................ 333/1

FOREIGN PATENT DOCUMENTS

JP          8-10932      3/1996
WO     WO 92/04745      3/1992

* cited by examiner

*Primary Examiner*—Benny Lee
(74) *Attorney, Agent, or Firm*—Staas & Halsey LLP

(57) ABSTRACT

A flexible print cable includes signal lines and ground lines. The signal lines and the ground lines are disposed alternately on each of an upper surface and an under surface of a film. The positions of the signal lines on the upper surface correspond to the positions of the ground lines on the under surface. The positions of the signal lines on the under surface correspond to the positions of the ground lines on the upper surface. The ground lines are wider than the signal lines. An edge part of one of the ground lines on the upper surface in a width direction overlaps a part of one of the ground lines on the under surface. Another edge part of the ground line on the upper surface in the width direction overlaps a part of another one of the ground lines on the under surface.

3 Claims, 13 Drawing Sheets

FLEXIBLE PRINT CABLE HAVING ALTERNATING SIGNAL AND GROUND CONDUCTORS AND CONNECTOR FOR THE SAME

BACKGROUND OF THE INVENTION

1. Field of the Invention

The present invention generally relates to a flexible print cable and a connector for the same, and especially relates to a flexible print cable and a connector for the same that realize high-speed transfer in single mode.

2. Description of the Related Art

In recent years, processing speed of digital information in electronic devices has been accelerating. Thus, there are demands for accelerating the transmission of digital signals in the electronic devices at, for example, approximately 800 MHz. It should be noted that a flexible print cable is often used in an electronic device for electrically connecting one part to another part.

As for the signal transmission, two methods are provided, i.e., a single mode transmission method in which a signal line is used for a single signal and a balanced transmission method in which two signals are generated for a single signal and the two signals are transmitted by two signal lines. The balanced signal transmission method is less influenced by noise compared to the single mode transmission method. The balanced signal transmission method can transmit the signal normally at a high frequency to a large extent compared to the single mode transmission method. Thus, the balanced signal transmission method is being adopted in fields in which a signal is transmitted at high speed.

However, the balanced signal transmission method needs a special signal processing circuit for processing the two signals. Accordingly, in order to apply the balanced transmission method to electronic devices adopting the single mode transmission method, it is necessary to change the design to a large extent. Therefore, it is difficult to apply the balanced signal transmission method to these electronic devices.

There are demands for a technology realizing a high speed digital signal transmission using the single mode transmission method faster than the conventional technology, i.e., realizing a flexible print cable less influenced by noise using the single mode transmission method.

Figure 1:
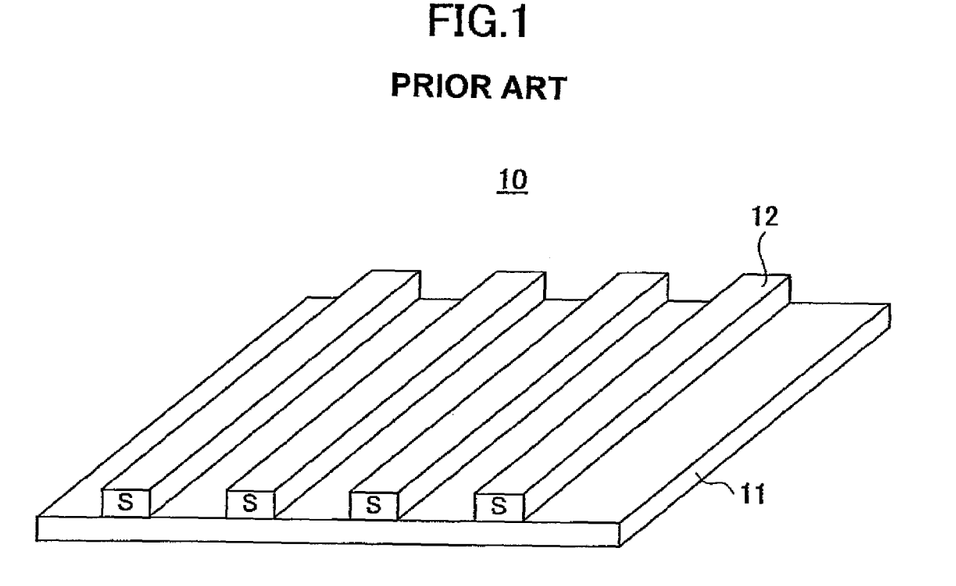
FIG. 1 is a view illustrating a conventional flexible print cable for single mode.

FIG. 1 is a view illustrating a conventional flexible print cable 10 for single mode. The cable 10 is configured to include a signal line pattern 12 of parallel signal lines (S) on the upper surface of a polyimide film 11. In the drawing, a protection film is not shown.

A connector to which an edge of the cable 10 is connected is configured to include only signal contacts forming a line.

The above described conventional flexible print cable for the single mode is disclosed in Japanese Laid-Open Utility Model Application No. 8-10932.

Accordingly, the cable 10 is configured to include the adjacent signal line patterns 12 merely separated spatially. Therefore, crosstalk, reflection and the like constrain the signal to be actually transmitted at, for example, 200 MHz or less.

Further, the connector to which the end of the cable 10 is connected is configured to include signal contacts merely separated spatially. Accordingly, crosstalk, reflection and the like are easily generated.

SUMMARY OF THE INVENTION

The present invention may provide a flexible print cable and a connector for the same, realizing high speed digital signal transmission in the single mode faster than the conventional cable and connector, that substantially obviate one or more problems caused by the limitations and disadvantages of the related art.

Features and advantages of the present invention are presented in the description which follows, and in part will become apparent from the description and the accompanying drawings, or may be learned by practice of the invention according to the teachings provided in the description. Objects as well as other features and advantages of the present invention may be realized and attained by the flexible print cable and the connector for the same particularly pointed out in the specification in such full, clear, concise, and exact terms as to enable a person having ordinary skill in the art to practice the invention.

To achieve these and other advantages in accordance with the purpose of the invention, a preferred embodiment of the invention provides a flexible print cable that includes signal lines and ground lines. The signal lines and the ground lines are disposed alternately on each of an upper surface and an under surface of a film. The positions of the signal lines on the upper surface correspond to the positions of the ground lines on the under surface. The positions of the signal lines on the under surface correspond to the positions of the ground lines on the upper surface. The ground lines are wider than the signal lines. An edge part of one of the ground lines on the upper surface in a width direction overlaps a part of one of the ground lines on the under surface. Another edge part of the ground line on the upper surface in the width direction overlaps a part of another one of the ground lines on the under surface.

According to at least one of the embodiments of the present invention, an edge part of one of the ground lines on the upper surface in a width direction overlaps a part of one of the ground lines on the under surface. Another edge part of the ground line on the upper surface in the width direction overlaps a part of another one of the ground lines on the under surface. Accordingly, the signal lines have a configuration similar to a microstrip line so as to attenuate crosstalk and to be less influenced by noise. Therefore, the flexible print cable and the connector according to at least one of the embodiments of the present invention realize digital signal transmission in the single mode at a speed a few times faster than the conventional flexible print cable and the connector.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention are described with reference to the accompanying drawings, where like features are designated by the same reference labels in the accompanying drawings.

First Embodiment

Figure 2:
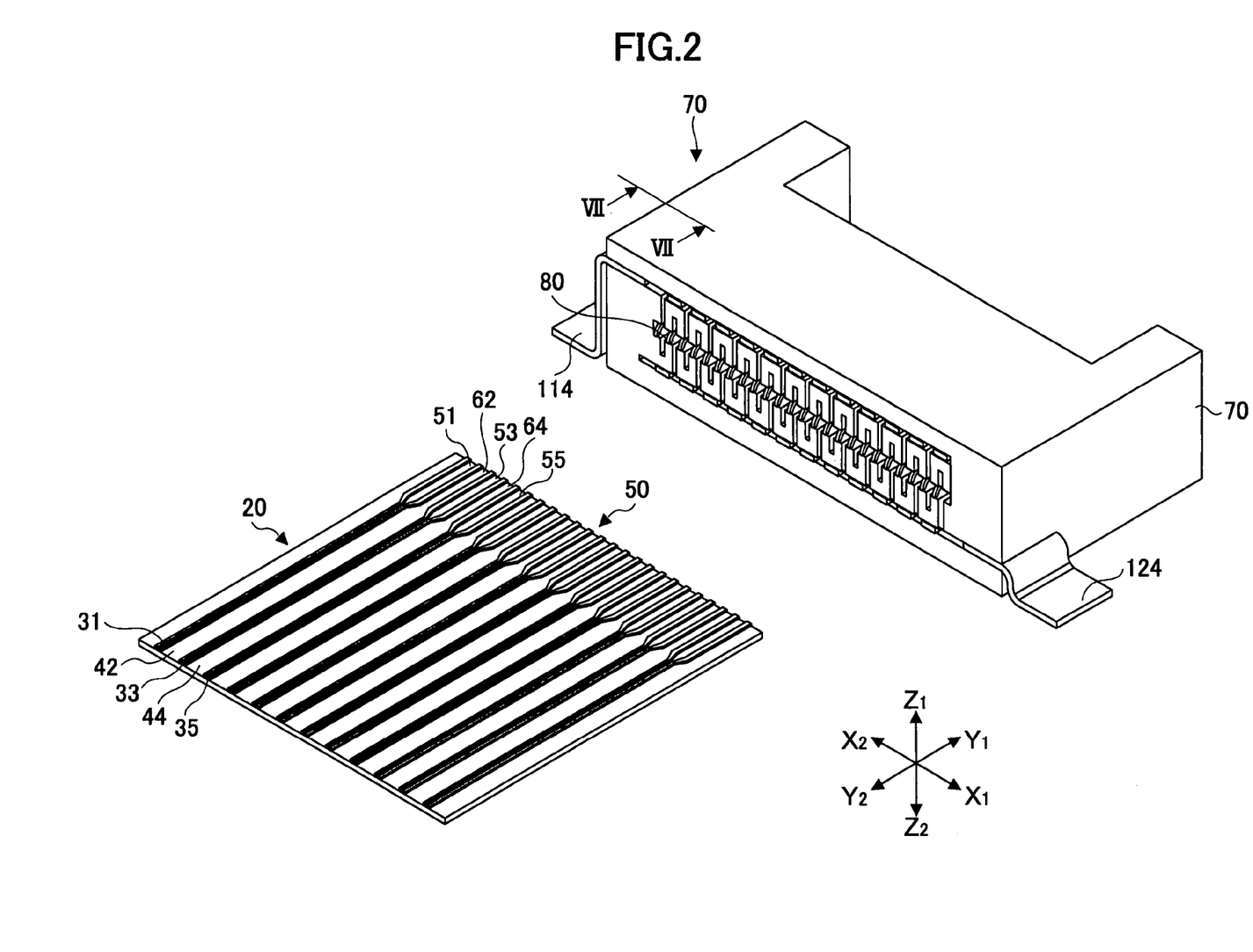
FIG. 2 is a perspective view illustrating a flexible print cable opposing a connector for the flexible print cable according to a first embodiment of the present invention.

FIG. 2 is a perspective view illustrating a flexible print cable 20 opposing a connector 70 for the flexible print cable according to a first embodiment of the present invention. Arrow $X1 \leftrightarrows X2$ is a width direction. Arrow $Y1 \leftrightarrows Y2$ is a connecting direction. Arrow $Z1 \leftrightarrows Z2$ is a thickness (height) direction.

[Flexible Print Cable 20]

Figure 3A:
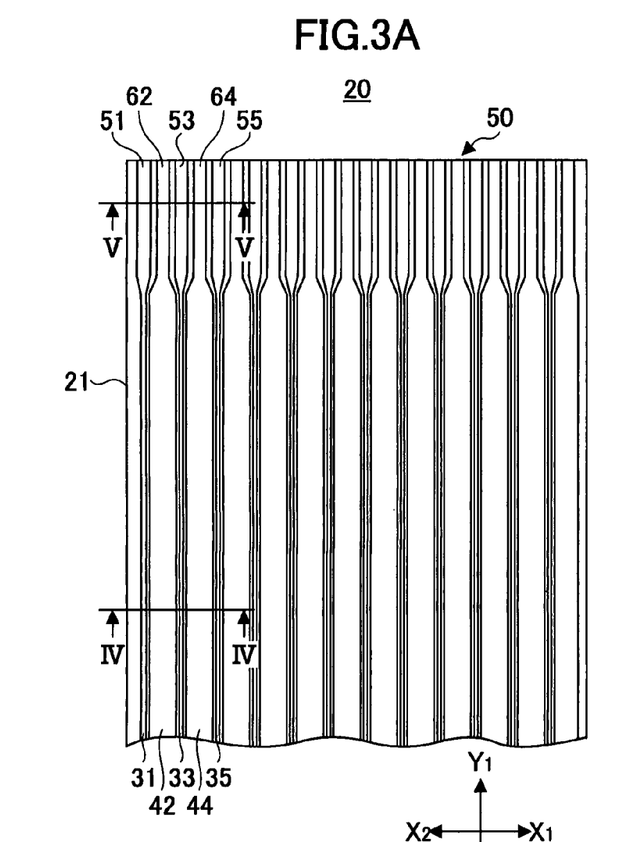
FIG. 3A is a plan view of the flexible print cable.
Figure 3B:
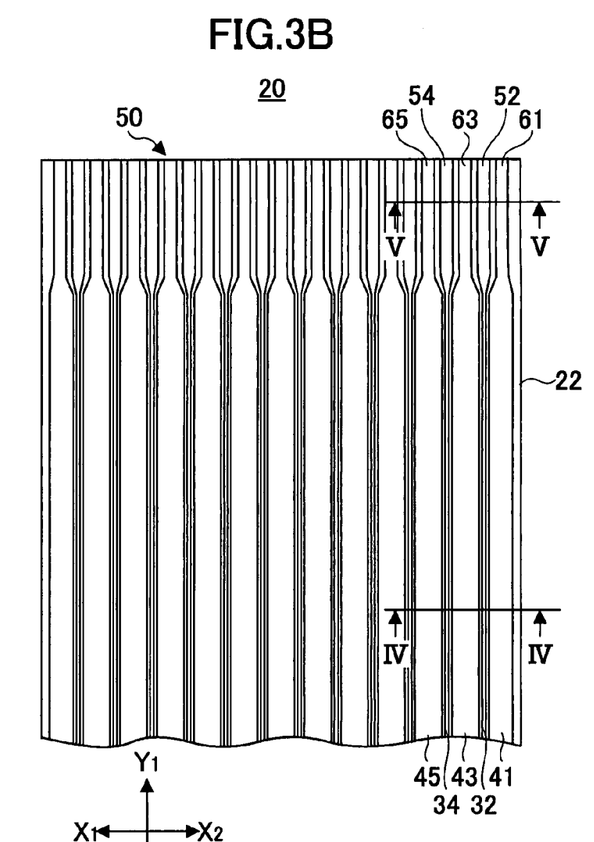
FIG. 3B is a bottom view of the flexible print cable.
Figure 4:
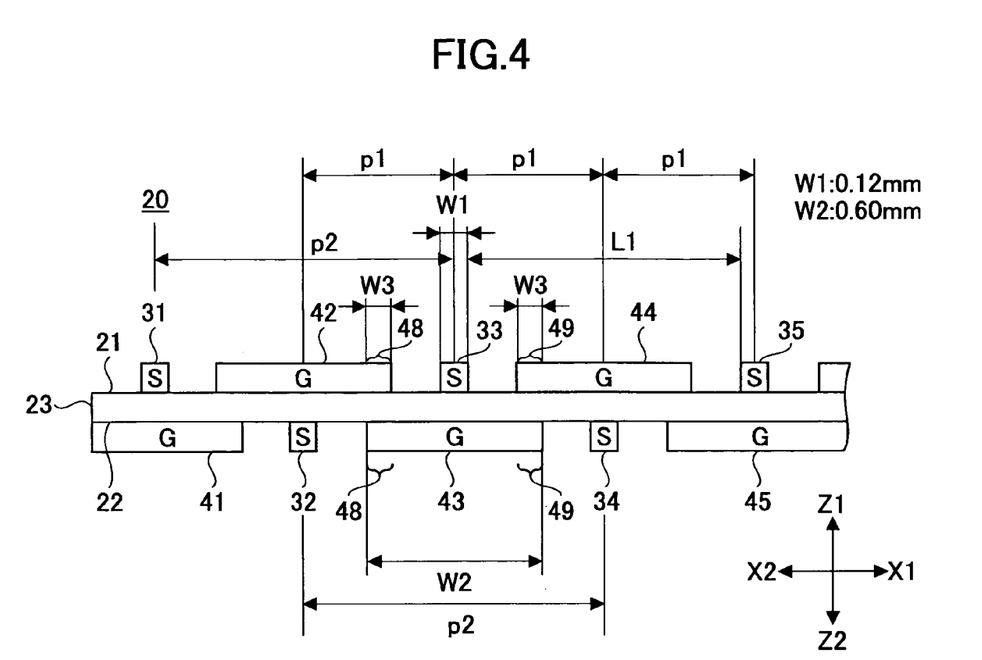
FIG. 4 is an enlarged cross-sectional view of the flexible print cable shown in FIGS. 3A and 3B taken along plane IV-IV.
Figure 5:
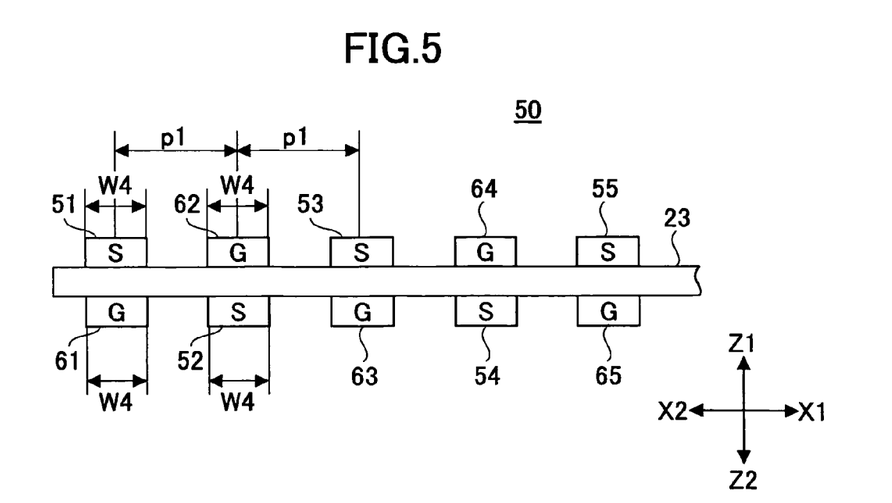
FIG. 5 is an enlarged cross-sectional view of the flexible print cable shown in FIGS. 3A and 3B taken along plane V-V.

FIG. 3A is a plan view illustrating an upper surface 21 of the flexible print cable 20. FIG. 3B is a bottom view illustrating an under surface 22 of the flexible print cable 20. FIG. 4 is an enlarged cross-sectional view of the flexible print cable 20 shown in FIGS. 3A and 3B taken along plane IV-IV. FIG. 5 is an enlarged cross-sectional view of the flexible print cable 20 shown in FIGS. 3A and 3B taken along plane V-V. In each of the drawings, a protecting film is not shown.

As shown in FIGS. 2, 3A, 3B and 4, the flexible print cable 20 is configured to include signal lines (designated by label S) and ground lines (designated by label G) disposed alternately on each of the upper surface 21 (FIGS. 3A & 4) of a polyimide film 23 (see FIG. 4) and on the under surface 22 (FIGS. 3B & 4) of the polyimide film 23. On the upper surface 21 of the polyimide film 23, from the X2 side to the X1 side, the signal lines of an odd number and the ground lines of an even number wherein the lines are counted from the X2 side are alternately provided, i.e., as shown in FIGS. 2, 3A & 4 the first signal line 31, the second ground line 42, the third signal line 33, the fourth ground line 44, the fifth signal line 35, . . . are provided at a pitch of p1 (see FIG. 4). On the under surface 22 of the polyimide film 23, from the X2 side to the X1 side, the ground lines of an odd number and the signal lines of an even number wherein the lines are counted from the X2 side are alternately provided, i.e., as shown in FIGS. 3B & 4 the first ground line 41, the second signal line 32, the third ground line 43, the fourth signal line 34, the fifth ground line 45 are alternately provided at a pitch of p1 (see FIG. 4) in the same way as the lines on the upper surface 21. The pitch between the adjacent signal lines 31 and 33 on the upper surface 21 of the polyimide film 23 and the pitch between the adjacent signal lines 32 and 34 on the under surface 22 of the polyimide film 23 are both p2 (see FIG. 4). The pitch p2 is twice as large as the pitch p1.

As shown in FIG. 4 when viewed from the $Z1 \leftrightarrows Z2$ direction, the signal lines 31, 33 and 35 on the upper surface 21 of the polyimide film 23 correspond to the ground lines 41, 43 and 45 on the under surface 22 of the polyimide film 23. The signal lines 32 and 34 on the under surface 22 of the polyimide film 23 correspond to the ground lines 42 and 44 on the upper surface 21 of the polyimide film 23. In other words, the signal line 31 on the upper surface 21 corresponds to the ground line 41 on the under surface 22. In addition to this, the signal line 32 on the under surface 22 corresponds to the ground line 42 on the upper surface 21.

The width W1 of the signal lines 31, 33, 35 is 0.12 mm, for example. The width W2 of the ground lines 41, 43, 45 is 0.6 mm, for example, which is five times as large as the width W1 of the signal lines 31, 33, 35. Viewed from the $Z1 \leftrightarrows Z2$ direction, a part of the ground line 43 on the X2 side on the under surface 22 of the polyimide film 23 and a part of the ground line 42 on the X1 side on the upper surface 21 of the polyimide film 23 overlap at a position having a width of W3 shown by a reference number 48. In the same way, a part of the ground line 43 on the X1 side and a part of the ground line 44 on the X2 side on the upper surface 21 of the polyimide film 23 overlap at a position having a width of W3 shown by a reference number 49. Accordingly, the signal line 33 on the upper surface 21 of the polyimide film 23 is opposed by the ground line 43 on the Z2 side, on the X2 side by an overlapping part 48 of the ground line 42 and the ground line 43, and on the X1 side by an overlapping part 49 of the ground line 44 and the ground line 43. The signal line 33 is surrounded by the ground lines in the Z2, X2 and X1 directions over the entire length of the signal line 33 so as to form a structure similar to a microstrip line. The other signal line 35 is surrounded by the ground lines in the Z2, X2 and X1 directions in the same way as the signal line 33. The signal lines 32 and 34 on the under surface 22 of the polyimide film 23 are surrounded by the ground lines in the Z1, X2 and X1 directions over the entire length of the signal lines 32 and 34. According to the structure similar to a microstrip line, when transmitting a digital signal, crosstalk between the adjacent signal lines 33 and 35 on the upper surface 21 of the polyimide film 23, crosstalk between the adjacent signal lines 32 and 34 on the under surface 22 of the polyimide film 23, and crosstalk between the signal line 33 on the upper surface 21 of the polyimide film 23 and the signal lines 32 and 34 on the under surface 22 of the polyimide film 23 are prevented. In addition, the signal lines are less influenced by external noise.

Further, noise passing through the overlapping parts 48 and 49 is interfered with by the ground lines on the upper surface 21 and the ground lines on the under surface 22 so as to improve absorption of the passing noise.

Moreover, the width W1 of the signal lines 31, 33, 35 is as small as 0.12 mm. Accordingly, an interval L1 between the adjacent signal lines becomes wide. This also prevents crosstalk between the adjacent signal lines.

It should be noted that according to the above structure, an impedance of each of the signal lines 31, 33, 35 is substantially 100 Ω.

When a width of a signal terminal and a ground terminal of an edge terminal structure part 50 (see FIGS. 2, 5) described below is defined as a standard, the width W1 of the signal lines 31, 33, 35 is less than the width of the signal terminal. The width W2 of the ground lines 41 through 45 is greater than the width of the ground terminal.

On the end of the flexible print cable 20, the edge terminal structure part 50 is formed as shown in FIGS. 3A, 3B and 5. The edge terminal structure part 50 is configured to include the signal terminals and the ground terminals disposed alternately. On the upper surface 21 (see FIG. 3A) of the polyimide film 23, from the X2 side to the X1 side (see, FIGS. 3A and 5), the signal terminals of an odd number and the ground terminals of an even number wherein the terminals are counted from the X2 side are provided, i.e. the first signal terminal 51, the second ground terminal 62, the third signal terminal 53, the fourth ground terminal 64, the fifth signal terminal 55, . . . are provided at a pitch of p1 (see FIG. 5). On the under surface 22 (see FIG. 3B) of the polyimide film 23, from the X2 side to the X1 side (see FIGS. 3B and 5), the ground terminals of an odd number and the signal terminals of an even number wherein the terminals are counted from the X2 side are provided, i.e., the first ground terminal 61, the second signal terminal 52, the third ground terminal 63, the fourth signal terminal 54, the fifth ground terminal 65, . . . are provided at a pitch of p1. The signal terminals have a width greater than the width of the signal lines. The ground terminals have a width less than the width of the ground lines. The signal terminals and the ground terminals have the same width W4 (see FIG. 5).

The edge terminal structure part 50 of FIG. 5, viewed in the Z1⇌Z2 direction, includes signal terminals 51, 53 and 55 on the upper surface 21 of the polyimide film 23 corresponding to ground terminals 61, 63 and 65 on the under surface 22 of the polyimide film 23. The signal terminals 52 and 54 on the under surface 22 of the polyimide film 23 correspond to ground terminals 62 and 64 on the upper surface 21 of the polyimide film 23.

[Connector 70 for Flexible Print Cable]

Figure 6:
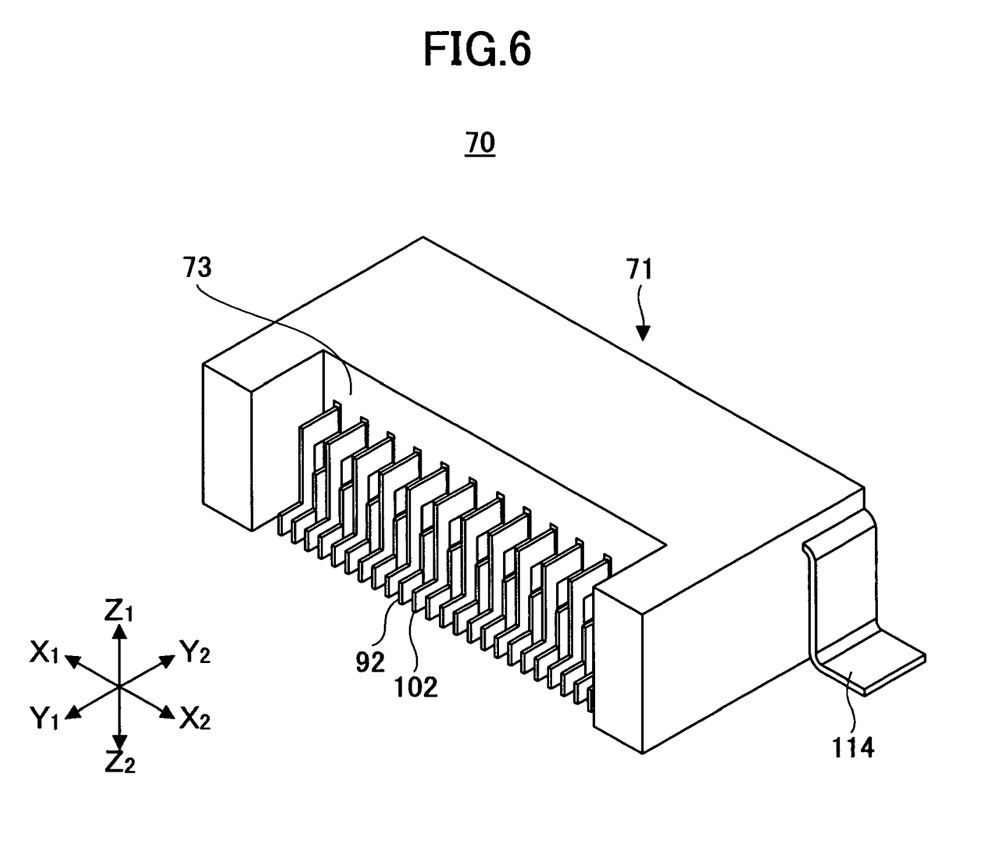
FIG. 6 is a perspective view of the connector for the flexible print cable shown in FIG. 2 viewed from the back thereof.
Figure 7:
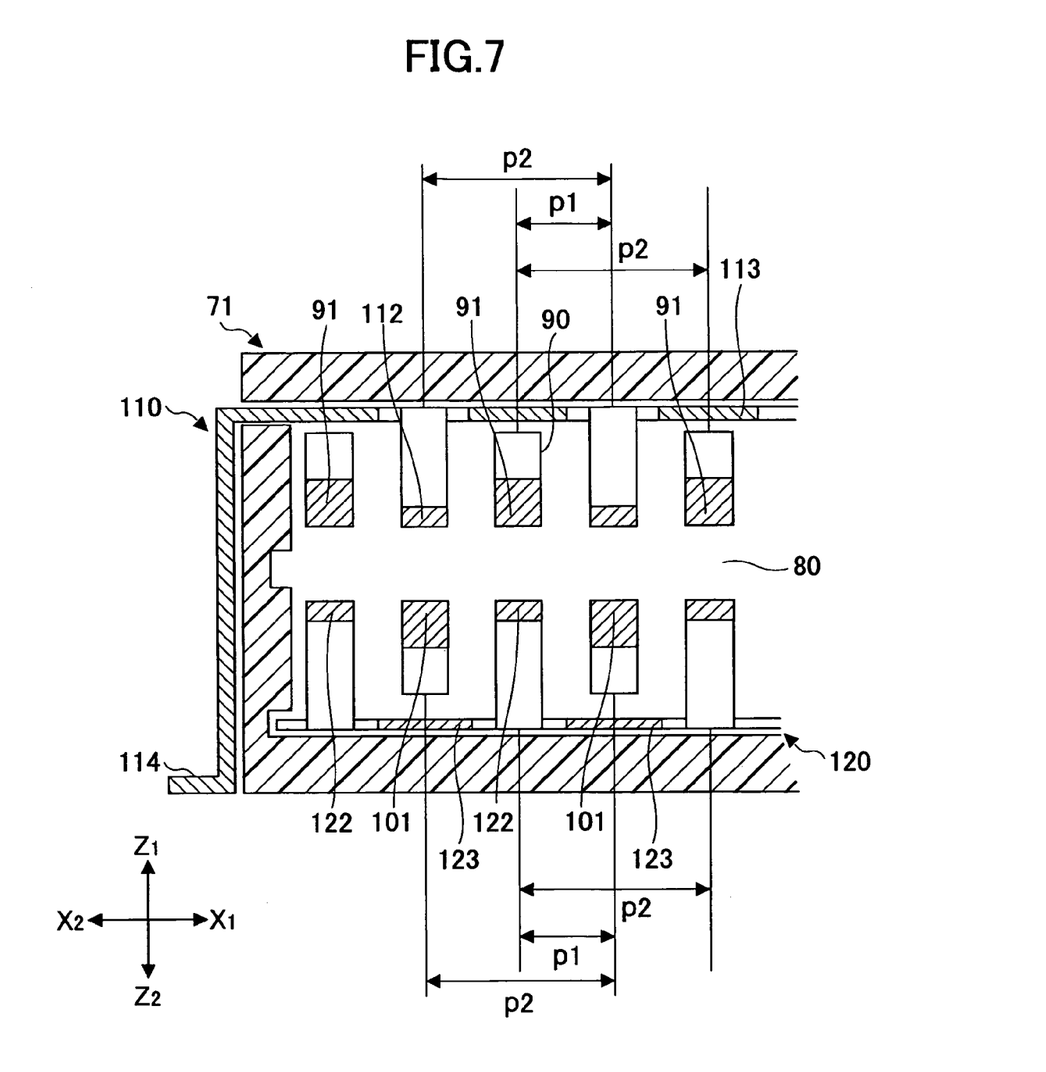
FIG. 7 is an enlarged cross-sectional view illustrating the connector for the flexible print cable shown in FIG. 2 taken along the X-Z plane including the plane VII-VII.
Figure 8:
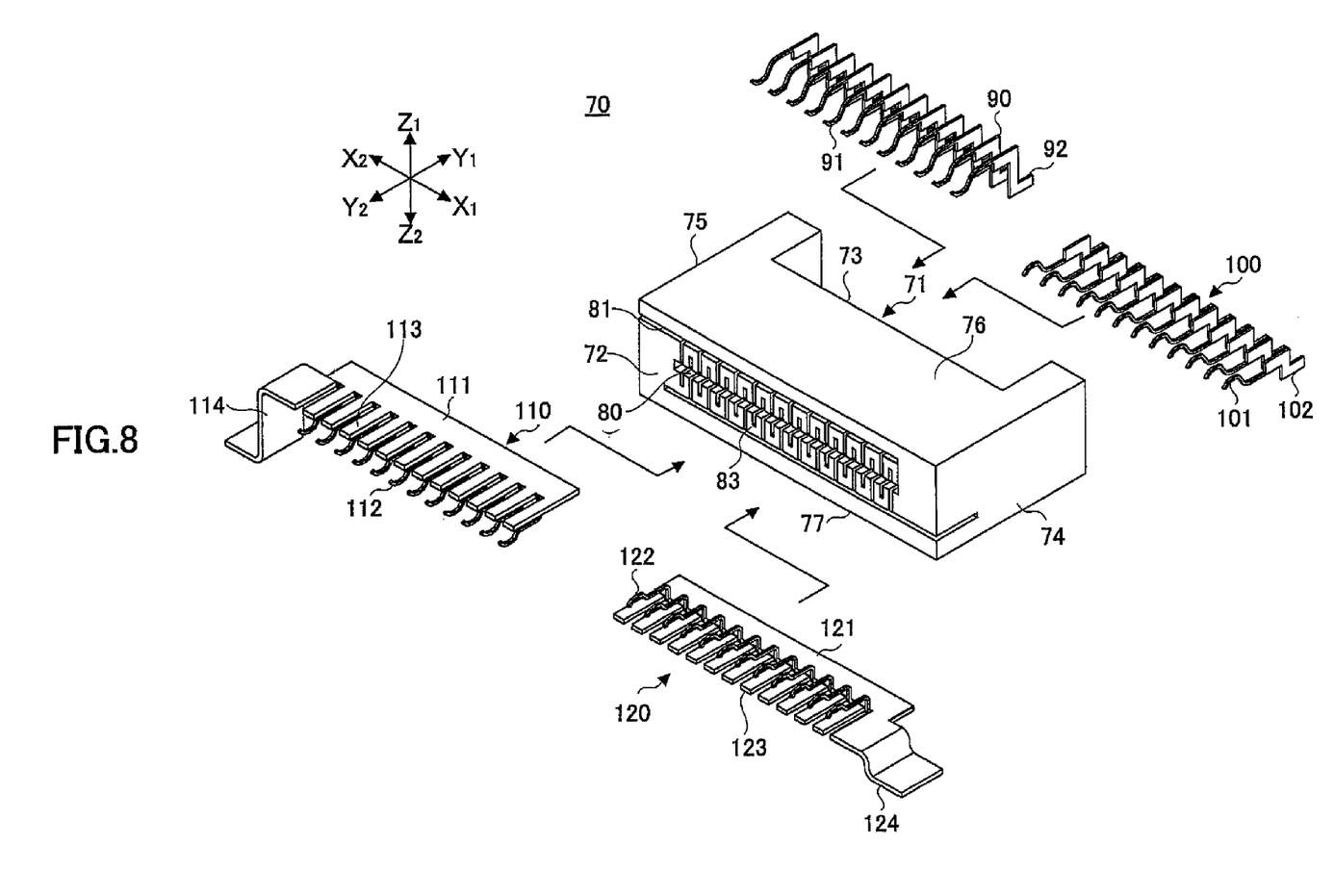
FIG. 8 is an exploded perspective view illustrating the connector for the flexible print cable shown in FIG. 2.

FIG. 6 is a perspective view of the connector 70 for the flexible print cable viewed from the back thereof. FIG. 7 is an enlarged cross-sectional view illustrating the connector 70 for the flexible print cable shown in FIG. 2 taken along the X-Z plane including the plane VII-VII. FIG. 8 is an exploded perspective view illustrating the connector 70 for the flexible print cable shown in FIG. 2.

The connector 70 for the cable is a right angle type and a ground contact unified type including plural ground contacts. In addition, the connector 70 for the cable is configured to be connected directly to the edge terminal structure part 50 on the end of the flexible print cable 20.

The connector 70 for the cable as shown in FIGS. 2, 6, 7 and 8 which is a formed part made from a synthetic resin with electric insulating properties is configured to include a signal contact member 90 on the Z1 side and signal contact member 100 on the Z2 side which are press fit in plural slits formed in the housing 71 from the back surface of the housing 71 on the Y1 side. In addition, a ground contact member 110 on the Z1 side and a ground contact member 120 on the Z2 side are press fit in the housing 71 from the front surface thereof on the Y2 side.

Figure 9:
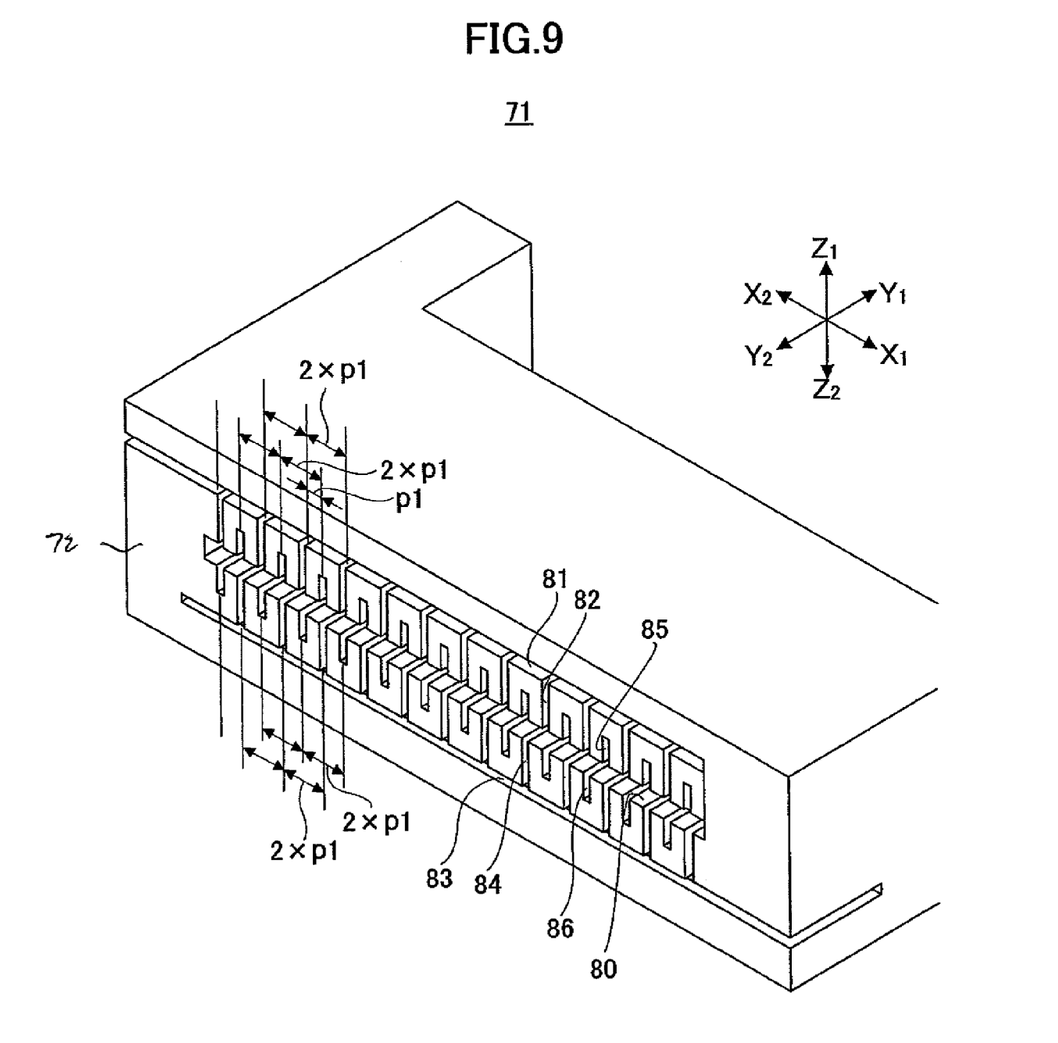
FIG. 9 is an enlarged view illustrating a housing of the connector for the flexible print cable.

As shown in FIG. 8, the housing 71 includes a front surface 72, a back surface 73, a lateral side 74 on the X1 side, another lateral side 75 on the X2 side, an upper surface 76 and an under surface 77. As an enlarged view in FIG. 9 shows, on the front surface 72, an edge terminal structure part insertion and connection opening 80, a slit 81 for press fitting the ground contact member 110 (see FIG. 8) on the Z1 side and a slit 83 for press fitting the ground contact member 120 (see FIG. 7) on the Z2 side are provided wherein all of which extend in the X1⇌X2 direction. The insertion and connection opening 80 is located at substantially the center of the housing 71. The slit 81 positioned over the insertion and connection opening 80 on the Z1 side penetrates the lateral side 75. The slit 83 positioned under the insertion and connection opening 80 on the Z2 side penetrates the lateral side 74. Between the slit 81 and the insertion and connection opening 80, the slits 82 are formed where a length direction thereof is in the Z1⇌Z2 direction at a pitch of p1. Between the slit 83 and the insertion and connection opening 80, the slits 84 are formed where a length direction thereof is in the Z1⇌Z2 direction at a pitch of 2×p1. Each of the slits 82 and its own slit 84 jolt out of alignment by a pitch of p1.

Further, the housing 71 includes slits 85 for press fitting signal contact member 90 on the Z1 side and slits 86 for press fitting signal contact member 100 on the Z2 side. The slits 85 form a line along an edge of the insertion and connection opening 80 on the Z1 side where a length direction thereof is in the Z1⇌Z2 direction at a pitch of 2×p1. The slits 86 form a line along an edge of the insertion and connection opening 80 on the Z2 side where a length direction thereof is in the Z1⇌Z2 direction at a pitch of 2×p1 in the same way as the slits 85. Each of the slits 85 and its own slit 86 jolt out of alignment by a pitch of p1.

In the Z1⇌Z2 direction, each of the slits 82 and its own slit 86 are in alignment. In addition, each of the slits 85 and its own slit 84 also are in alignment.

As shown in FIG. 8, the signal contact member 90 on the Z1 side having substantially an L shaped form includes signal contacts 91 on the edge in the Y2 direction and terminal parts 92 for soldering on the edge in the Y1 direction. The contact member 90 is press fit in the slits 85. The signal contact member 100 on the Z2 side having substantially an L shaped form includes signal contacts 101 on the edge in the Y2 direction and terminal parts 102 for soldering on the edge in the Y1 direction. The contact member 100 is press fit in the slits 86.

As shown in FIG. 7, the signal contacts 91 and the signal contacts 101 are disposed in the X1⇌X2 direction forming a zigzag shape. Further, as shown in FIG. 6, on the back surface 73 of the housing 71, the terminal parts 92 and 102 for soldering are disposed alternately.

Returning to FIG. 8, the ground contact member 110 on the Z1 side includes a belt part 111 extending in the X1⇌X2 direction, plural ground contacts 112 protruding in the Y2 direction from the belt part 111 forming substantially a comb shape, plural covering parts 113 protruding between the adjacent ground contacts 112, and a terminal part 114 for soldering having an L shaped form on the edge of the belt part 111 on the X2 side. The ground contact member 110 is unified with the plural ground contacts 112. The ground contacts 112 and the covering parts 113 are alternately disposed at a pitch of 2×p1 jolting out of alignment at a pitch of p1 (shown in FIG. 7).

The ground contact member 110 on the Z1 side is press fit in the slit 81 from the front surface 72 of the housing 71. The ground contacts 112 are press fit in the slits 82.

As shown in FIG. 7, the ground contacts 112 are positioned between the adjacent contact members 90 and oppose the signal contacts 101 on the Z2 side across the insertion and connection opening 80. The covering parts 113 and a part of the belt part 111 cover the contact members 90 on the Z1 side. Accordingly, the contact members 90 oppose the ground contacts 112 on the X1 and X2 sides, and further oppose the covering parts 113 and the part of the belt part 111 on the Z1 side. Further, the contact members 90 are surrounded by the ground contact member 110 on three sides, i.e., the X1, X2 and Z1 sides.

Moreover, the signal contacts 91 on the Z2 side oppose the ground contacts 122 across the insertion and connection opening 80. Accordingly, the signal contacts 91 are surrounded by the ground contact member 110 and the ground contacts 122 on the four sides, i.e., X1, X2, Z1 and Z2 sides.

The terminal part 114 for soldering protrudes from the lateral side 75 of the housing 71 and is led along the lateral side 75.

Returning to FIG. 8, the ground contact member 120 on the Z2 side having a shape substantially symmetric to the ground contact member 110 on the Z1 side includes a belt part 121 extending in the X1⇌X2 direction, the plural ground contacts 122 protruding from the belt part 121 in the Y2 direction forming substantially a comb shape, plural covering parts 123 protruding between the adjacent ground contacts 122 and a terminal part 124 for soldering having substantially an L shaped form on the edge of the belt part 121 on the X1 side. The ground contact member 120 on the Z2 side is unified with the plural ground contacts 122. The ground contacts 122 and the covering parts 123 are disposed at a pitch of 2×p1 jolting out of an alignment at a pitch of p1 (shown in FIG. 7).

The ground contact member 120 on the Z2 side is press fit in the slit 83 from the front surface 72 of the housing 71. The ground contacts 122 are press fit in the slits 84.

As shown in FIG. 7, the ground contacts 122 are disposed between the adjacent parts of the contact member 100 and oppose the signal contacts 91 on the Z1 side across the insertion and connection opening 80. The covering parts 123 and a part of the belt part 121 cover the contact member 100 on the Z1 side. Accordingly, the contact member 100 on the X1 and X2 sides opposes the ground contacts 122, and on the Z1 side thereof opposes the covering parts 123 and the part of the belt part 121. Therefore, the contact member 100 is surrounded by the ground contact members 120 on three sides, i.e., the X1, X2 and Z2 sides.

Further, each of the signal contacts 101 on the Z1 side opposes its own ground contact 112 across the insertion and connection opening 80. Accordingly, each of the signal contacts 101 is surrounded by the ground contact members 120 and the ground contacts 112, i.e., surrounded on four sides, i.e., the X1, X2, Z1 and Z2 sides.

The terminal part 124 for soldering protrudes from the lateral side 74 of the housing 71.

The connector 70 with the above described configuration is mounted on the substrate by soldering the terminal parts 92 and 102 for soldering onto the signal pad on the substrate and soldering the terminal parts 114 and 124 on corresponding edges for soldering onto the ground pad on the substrate. While the connector 70 is mounted on the substrate, the ground contact members 110 and 120 are both at ground potential. Thus, the contact member 90 is surrounded by the ground contact member 110 at ground potential on three sides, i.e., the X1, X2 and Z1 sides. The contact member 100 is surrounded by the ground contact member 120 at ground potential on three sides, i.e., the X1, X2 and Z2 sides.

Moreover, as shown in FIG. 7, the signal contacts 91 oppose the ground contacts 122 in the Z1⇌Z2 direction across the insertion and connection opening 80. In addition, the ground contacts 112 oppose the signal contacts 101 across the insertion and connection opening 80. Accordingly, each of the contacts 91 and 101 are surrounded by the ground contact members 110 and 120 at ground potential on four sides, i.e., the X1, X2, Z1 and Z2 sides.

Furthermore, as for grounding, the soldering places are limited to two points, the terminal parts 114 and 124 for soldering. Accordingly, it is not necessary to form a complex grounding pattern on the substrate. Thus, the patterning on the substrate is simplified.

Figure 10:
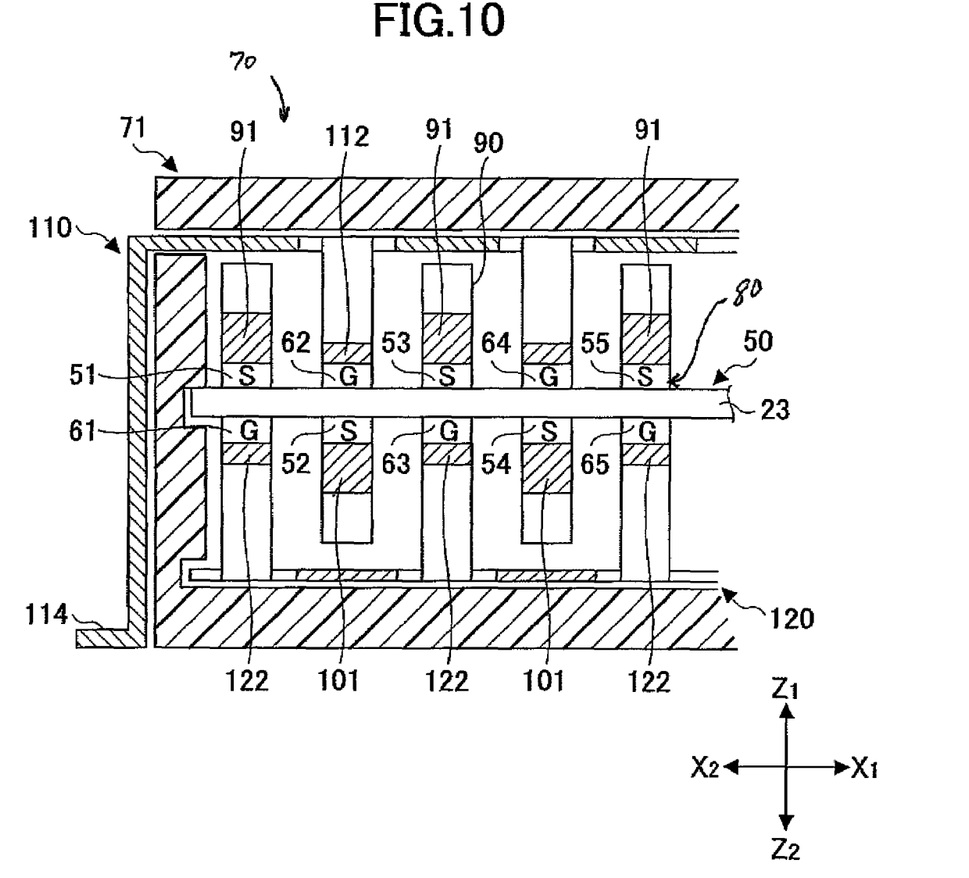
FIG. 10 is a view illustrating where an edge terminal structure part of the flexible print cable is connected to the connector.

[Connecting Cable 20 to Connector 70]The flexible print cable 20 is connected to the connector 70 by inserting the edge terminal structure part 50 of the flexible print cable 20 into the insertion and connection opening 80 of the connector 70 as shown in FIG. 10. The edge terminal structure part 50 and the connector 70 are connected as shown in FIG. 10, wherein the edge terminal structure part 50 is surrounded by the signal contacts 91 and the ground contacts 112 on the Z1 side and by the signal contacts 101 and the ground contacts 122 on the Z2 side. The signal terminals 51, 53 and 55 contact the signal contacts 91. The ground terminals 62 and 64 contact the ground contacts 112. The signal terminals 52 and 54 contact the signal contacts 101. The ground terminals 61, 63 and 65 contact the ground contacts 122.

The digital signal transmitted in the flexible print cable 20 in the single mode is transmitted to the substrate via the signal contact members 90 and 100 in the connector 70.

Since the signal contacts 91 and 101 are surrounded by the ground contact members 110 and 120 at ground potential on three sides, crosstalk between the adjacent signal contacts is prevented while the digital signal is transmitted through the signal terminal 51 (53 and 55) and the signal contact 91 and through the signal terminal 52 (54) and the signal contact 101.

As described above, the flexible print cable 20 and the connector 70 are configured to attenuate a crosstalk and to be less influenced by the external noise, it is possible to transmit a digital signal in the electronic device in the single mode at a speed a few times as fast as the conventional device, for example at 800 MHz.

Second Embodiment

Figure 11:
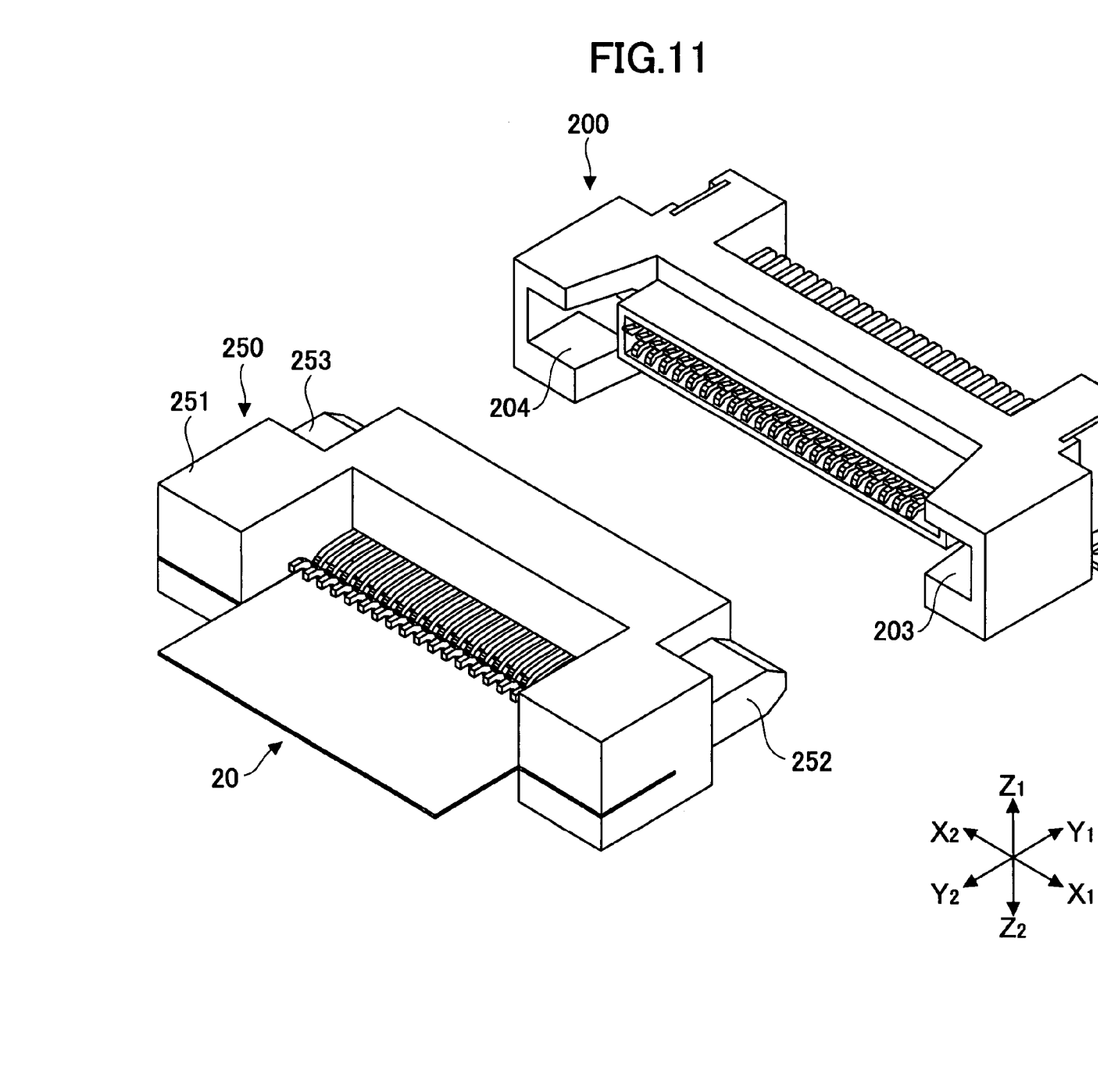
FIG. 11 is a perspective view illustrating the flexible print cable shown in FIG. 2 opposing the connector for the flexible print cable.

FIG. 11 is a perspective view illustrating the flexible print cable 20 opposing the connector 200 according to the second embodiment of the present invention.

Figure 12:
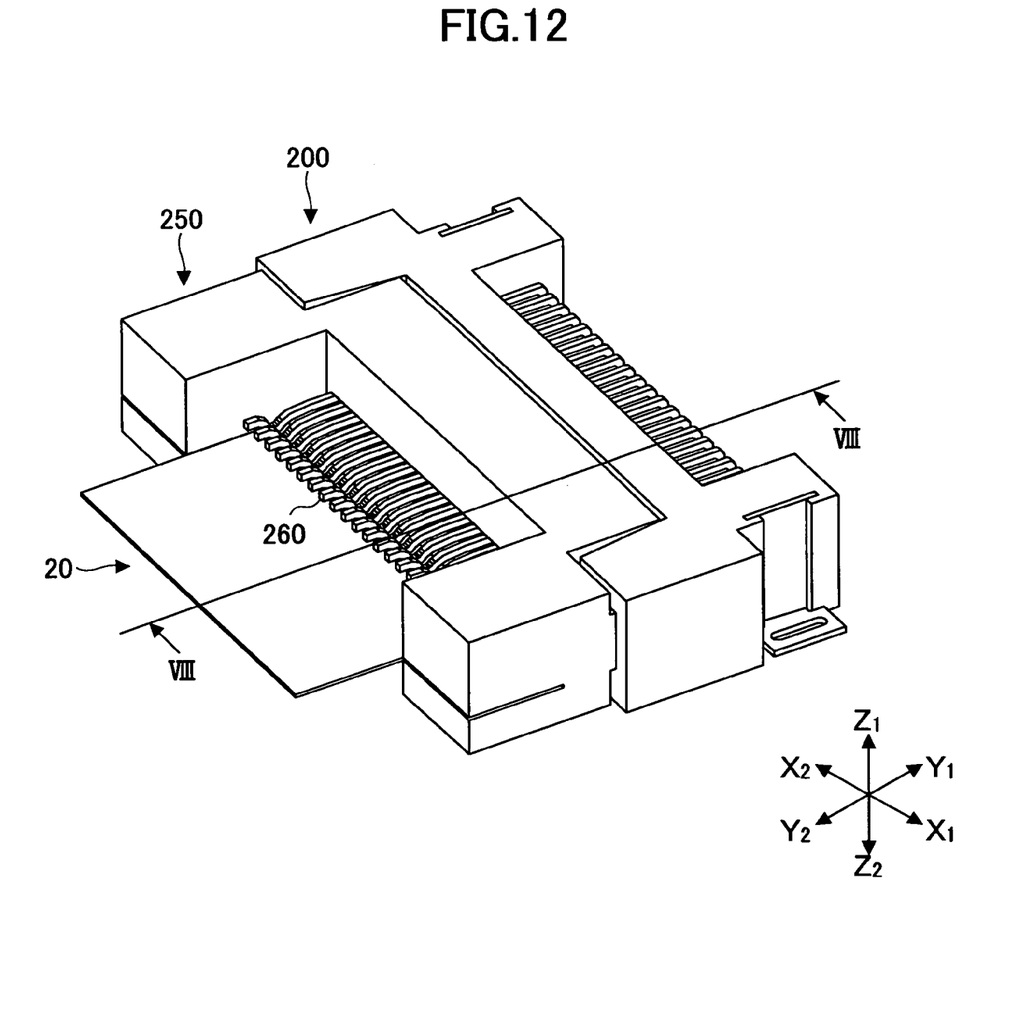
FIG. 12 is a view illustrating a plug on the edge of the flexible print cable connected to the connector for the flexible print cable.
Figure 13:
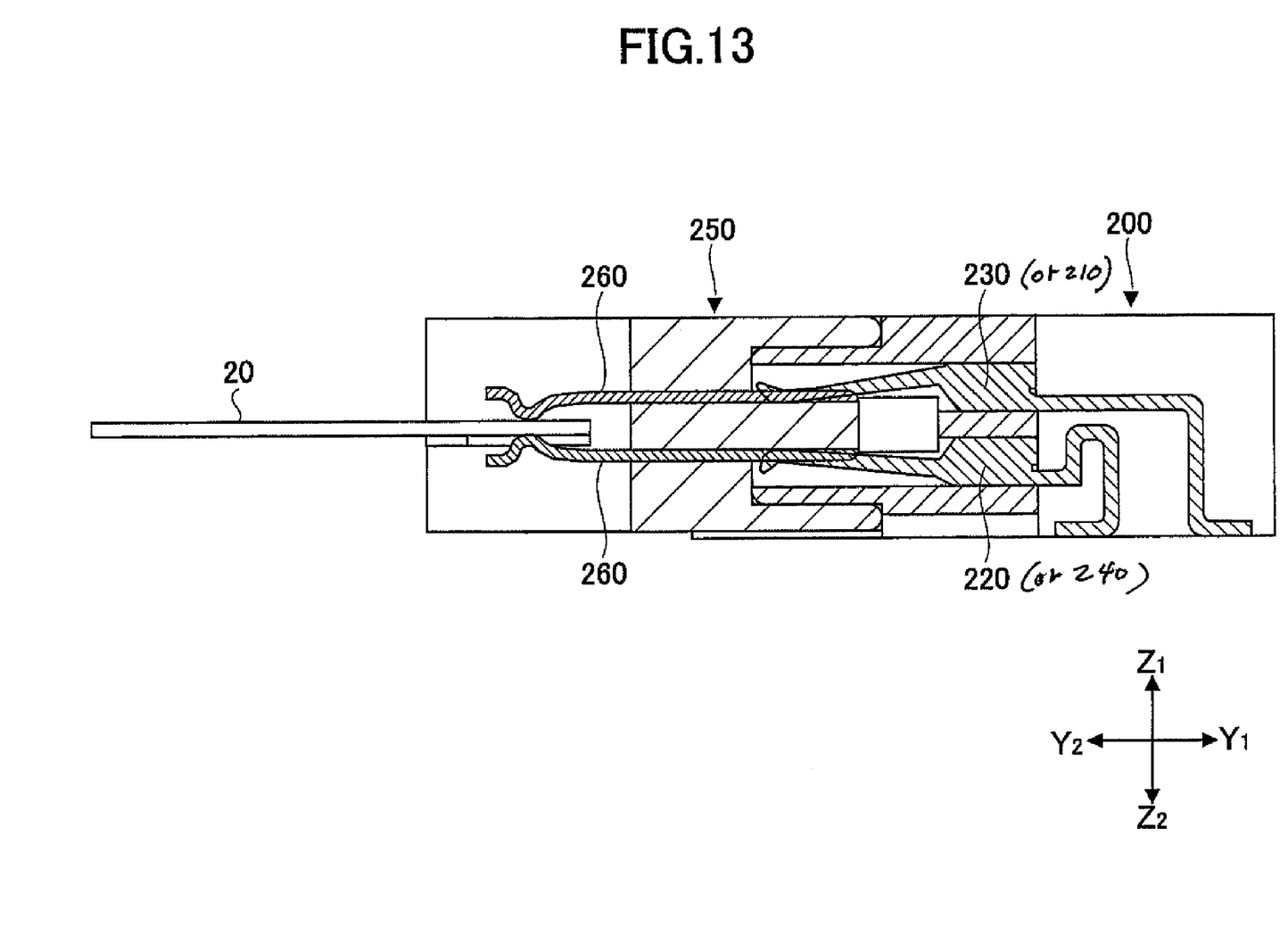
FIG. 13 is a cross-sectional view of the plug and the connector shown in FIG. 12 taken along plane VIII-VIII.

According to the present embodiment, a plug 250 is provided on the edge terminal structure part 50 of the flexible print cable 20. The plug 250 is connected to the connector 200 as shown in FIGS. 12 and 13.

Figure 14:
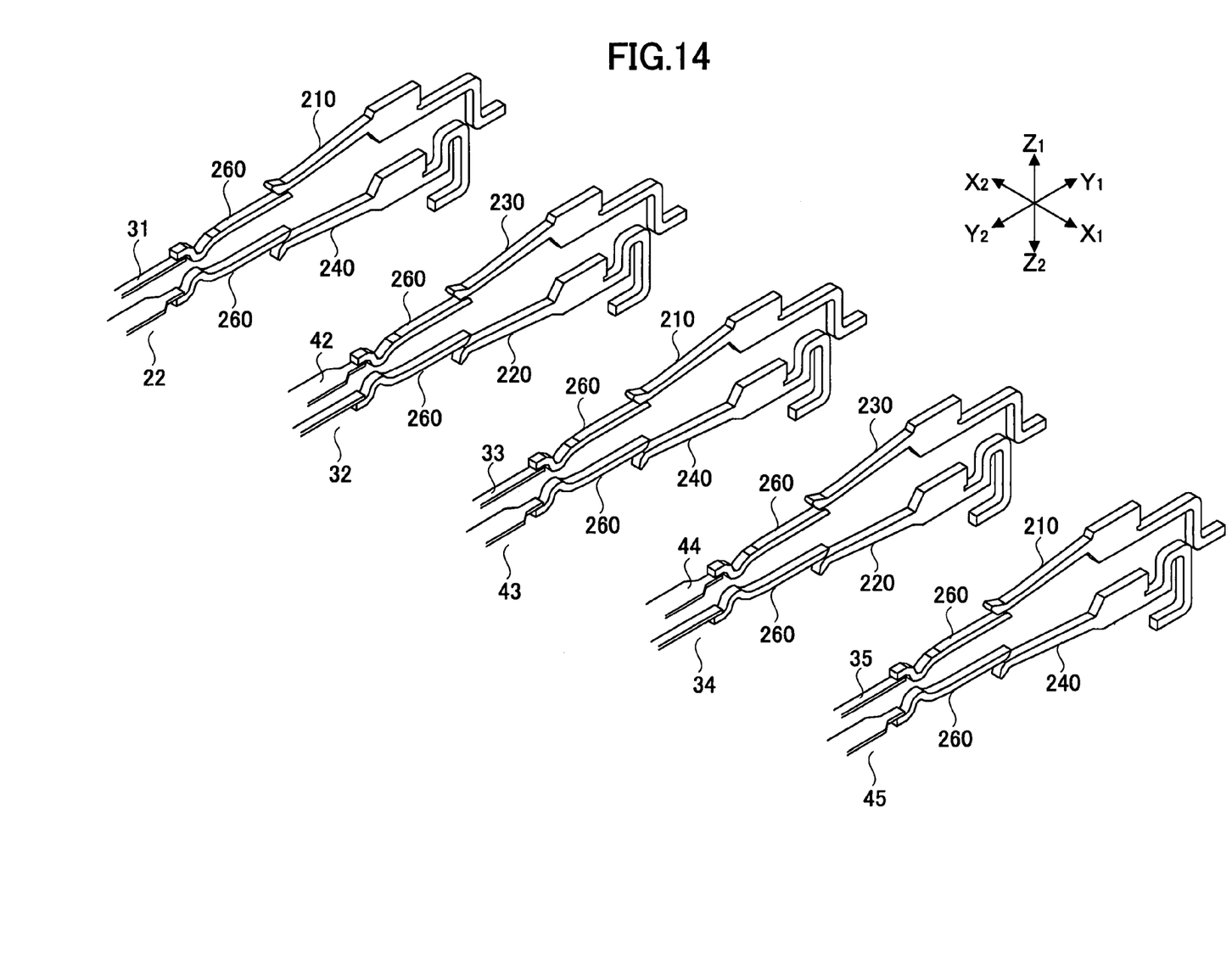
FIG. 14 is a perspective view illustrating where edge members are connected.

The plug 250 (see FIGS. 12, 13) is configured to include contacts 260 forming two alignments in the housing 251 made from synthetic resin as shown in FIG. 14. The signal terminals and the ground terminals of the edge terminal structure part 50 of the flexible print cable 20 are soldered onto the corresponding contacts 260. The housing 251 includes connection guiding parts 252 and 253 on corresponding edges of the housing 251 on the Y1 side.

The connector 200 is a right angle type and a ground contact separated and independent type in which each of the ground contacts is separated and independent. The connector 200 is configured to be connected to the plug 250.

The connector 200 is configured to include signal contact members 210 and 220, and ground contact members 230 and 240 forming two alignments in the housing 251 made from a synthetic resin. On the Z1 side, the signal contact members 210 and the ground contact members 230 are alternately provided in the X1⇆X2 direction. On the Z2 side, the ground contact members 240 and the signal contact members 220 are alternately provided in the X1⇆X2 direction. In the Z1⇆Z2 direction, each of the signal contact members 210 and its own ground contact member 240 form an alignment. In addition, each of the ground contact members 230 and its own signal contact member 220 form an alignment.

In the connector 200, the signal contact members 210 and 220 are shielded by the ground contact members 230 and 240 on the X1 and X2 sides. This is effective in attenuating crosstalk.

The plug 250 is connected to the connector 200 as shown in FIGS. 12 and 13 by engaging the connection guiding parts 252 and 253 of the plug 250 in connection guiding groove parts 203 and 204, respectively, of the connector 200 as shown in FIG. 11. As shown in FIGS. 13 and 14, the contacts 260 of the plug 250 (see FIG. 13) are connected to the signal contact members 210 and 220 and the ground contact members 230 and 240 in the connector 200 as shown in FIG. 14.

As described above, the flexible print cable 20 and the connector 200 are configured to attenuate a crosstalk. Accordingly, it is possible to transmit a digital signal in the electronic devices in the single mode at a speed a few times as fast as the conventional devices, for example at 800 MHz.

It should be noted that the edge terminal structure part 50 of the flexible print cable 20 can be directly connected to the above described connector 200 by adjusting the size of each of the components of the connector 200 accordingly.

Further, the present invention is not limited to these embodiments, but variations and modifications may be made without departing from the scope of the present invention.

The present application is based on Japanese Priority Application No. 2005-173676 filed on Jun. 14, 2005 with the Japanese Patent Office, the entire contents of which are hereby incorporated by reference.

What is claimed is:

1. A connector for a flexible print cable to which an end of the flexible print cable is connected, comprising;
   a housing including an insertion and connection opening on a front surface of said housing, wherein an end of the flexible print cable is inserted and connected to said insertion and connection opening;
   signal contacts and ground contacts disposed alternately on each of an upper side and an under side of the insertion and connection opening;
   each of said signal contacts on the upper side opposes a corresponding one of the ground contacts on the under side across the insertion and connection opening;
   each of said ground contacts on the upper side opposes a corresponding one of the signal contacts on the under side across the insertion and connection opening;
   the ground contacts on the upper side are a part of an upper ground contact member, said upper ground contact member including a first belt part, a plurality of the ground contacts on the upper side protruding from said first belt part having a comb shape, and a plurality of upper covering parts protruding between the adjacent ground contacts on the upper side; and
   the ground contacts on the under side are a part of an under ground contact member, said under ground contact member including a second belt part, a plurality of the ground contacts on the under side protruding from said second belt part having a comb shape, and a plurality of under covering parts protruding between the adjacent ground contacts on the under side, wherein:
      the upper covering parts are disposed over the signal contacts on the upper side,
      each of the signal contacts on the upper side opposes the corresponding ground contact on the under side across the insertion and connection opening,
      the under covering parts are disposed under the signal contacts on the under side, and
      each of the signal contacts on the under side opposes the corresponding ground contact on the upper side across the insertion and connection opening.

2. A flexible print cable comprising a plurality of signal lines and a plurality of ground lines, said signal lines and said ground lines being disposed alternately on each of an upper surface and an under surface of a film, wherein:
   positions of the signal lines on the upper surface correspond to positions of the ground lines on the under surface, and
   positions of the signal lines on the under surface correspond to positions of the ground lines on the upper surface;
   the ground lines are wider than the signal lines;
   an edge part of one of the ground lines on the upper surface in a width direction overlaps a part of one of the ground lines on the under surface;
   another edge part of said one of the ground lines on the upper surface in the width direction overlaps a part of another one of the ground lines on the under surface; and
   the signal lines have a common width less than a common width of signal terminals disposed on ends of the signal lines, and the ground lines have a common width greater than a width of ground terminals disposed on ends of the ground lines.

3. The flexible print cable as claimed in claim 2, wherein an impedance of the flexible print cable is substantially 100 Ω.

* * * * *

UNITED STATES PATENT AND TRADEMARK OFFICE
CERTIFICATE OF CORRECTION

| | |
|---|---|
| PATENT NO. | : 7,352,257 B2 |
| APPLICATION NO. | : 11/300311 |
| DATED | : April 1, 2008 |
| INVENTOR(S) | : Koki Sato et al. |

Page 1 of 1

It is certified that error appears in the above-identified patent and that said Letters Patent is hereby corrected as shown below:

Title page, item [54] (Title), Lines 1-4, change "FLEXIBLE PRINT CABLE HAVING ALTERNATING SIGNAL AND GROUND CONDUCTORS AND CONNECTOR FOR THE SAME" to --FLEXIBLE PRINT CABLE AND CONNECTOR FOR THE SAME--.

Column 1 (Title), Lines 1-4, change "FLEXIBLE PRINT CABLE HAVING ALTERNATING SIGNAL AND GROUND CONDUCTORS AND CONNECTOR FOR THE SAME" to --FLEXIBLE PRINT CABLE AND CONNECTOR FOR THE SAME--.

Signed and Sealed this

Seventh Day of April, 2009

JOHN DOLL
*Acting Director of the United States Patent and Trademark Office*